(12) United States Patent
Gharpurey (10) Patent No.: US 6,734,736 B2
(45) Date of Patent: May 11, 2004

(54) LOW POWER VARIABLE GAIN AMPLIFIER

(75) Inventor: Ranjit Gharpurey, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/034,486

(22) Filed: Dec. 28, 2001

(65) Prior Publication Data

US 2003/0122622 A1 Jul. 3, 2003

(51) Int. Cl.[7] .............................. H03F 3/45; G06G 7/24; G06G 7/16
(52) U.S. Cl. ..................... 330/254; 330/260; 327/346; 327/359
(58) Field of Search ................... 330/254, 260; 327/346, 359

(56) References Cited

U.S. PATENT DOCUMENTS

| 6,052,030 | A | 4/2000 | Garner et al. ............... 330/282 |
| 6,211,737 | B1 | 4/2001 | Fong ........................ 330/282 |
| 6,278,321 | B1 | 8/2001 | Franck ...................... 330/254 |
| 6,300,832 | B1 | 10/2001 | Okazaki ..................... 330/254 |
| 6,304,142 | B1 * | 10/2001 | Madni ....................... 330/254 |
| 6,400,218 | B1 * | 6/2002 | Zocher et al. ............... 327/560 |
| 6,407,632 | B1 * | 6/2002 | Madni et al. ................ 330/85 |
| 6,466,090 | B1 * | 10/2002 | Giuroiu ..................... 330/86 |

OTHER PUBLICATIONS

Sahota, et al. *High Dynamic Range Variable–Gain Amplifier for CDMA Wireless Applications* Presented at ISSCC97. Feb. 8, 1997.

* cited by examiner

Primary Examiner—Patricia Nguyen
(74) Attorney, Agent, or Firm—Ronald O. Neerings; Wade James Brady, III; Frederick J. Telecky, Jr.

(57) ABSTRACT

A variable gain amplifier includes an input stage that receives an input signal and converts the input signal into a corresponding intermediate signal. An output stage provides an output signal based on the intermediate signal and a gain control signal, with feedback signal being provided to the input stage as a function of the gain control signal, so that the intermediate signal varies as a function of the input signal and the feedback signal. The linearity performance of the VGA is substantially constant at the output over the useful input range of signal amplitudes.

26 Claims, 8 Drawing Sheets

LOW POWER VARIABLE GAIN AMPLIFIER

TECHNICAL FIELD

The present invention relates generally to electrical circuits and, more particularly, to a low power variable gain amplifier.

BACKGROUND OF THE INVENTION

Variable gain amplifiers (VGAs) are useful in many applications. VGAs, for example, can be utilized in communications devices (e.g., direct conversion receivers, such as cordless and cellular phones), memory storage devices (e.g., hard disk drives, CD ROM drives, etc.) as well as other electronics, including global positioning (GPS) receivers, wireless local area networks and the like. In particular, VGAs are used in the various parts of such devices, for example, in the radio frequency (RF) input stage, intermediate frequency (IF) and low frequency or baseband circuits of these devices. Because it has variable gain, a VGA can provide a constant output for an input that varies according to changing operating parameters for a particular application.

Figure 1:
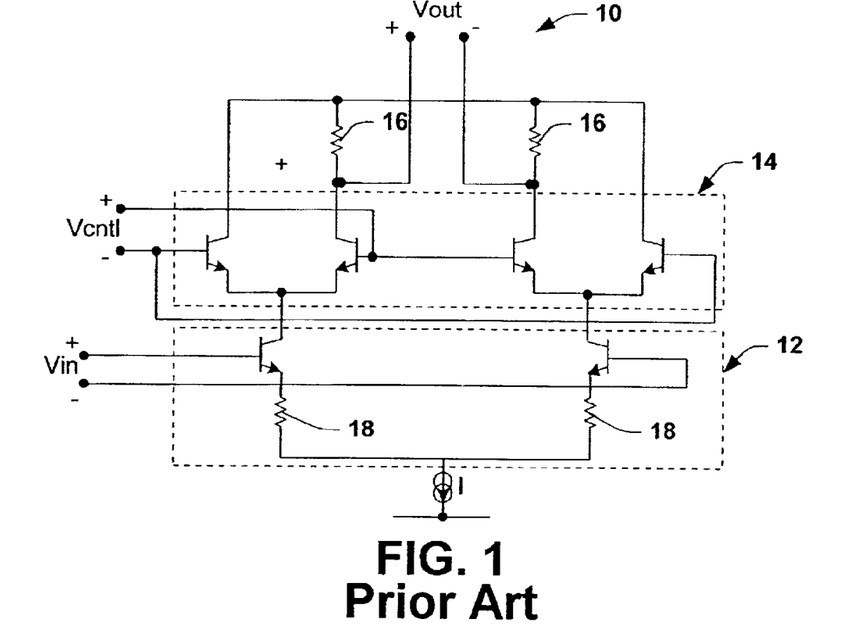
FIG. 1 is an example of a conventional variable gain amplifier.

Various solutions have been proposed to provide variable gain amplification. FIG. 1 illustrates one example of a traditional VGA 10. The VGA 10 includes an input transconductance stage 12, followed by a current steering circuit 14. The circuit 10 depicted in FIG. 1 achieves variable amplification by attenuating the current that flows into the load resistors 16 using a control voltage $V_{cntl}$. While this type of circuit arrangement is used in receivers, it is inherently unsuitable for receiver applications, because it has a constant input linearity (set by the input transconductor 12), rather than a fixed output saturation point. In particular, the transconductor 12 requires a sufficiently large input linearity to accommodate the largest input signal that is possible in the system. This places a restriction on the product of the degeneration resistance and the current I. It is possible to make the VGA 10 a low power circuit by lowering I and increasing the resistors 18 of the transconductance stage 12. However, the load resistance 16 is set at the product of the peak gain of the VGA and the degeneration resistance 18. Therefore, as the resistance of resistors 18 is increased, the output resistors 16 must be similarly increased. Due to bandwidth restrictions there is typically a maximum limit on the usable load resistance 16 in the circuit 10. Therefore the maximum value of degeneration resistance of the resistors 18 is limited, in practice. This in turn sets the minimum current that must be dissipated in the circuit to achieve required linearity performance. For typical levels of gain that are required in receiver applications, this current is usually unfavorable.

Figure 2:
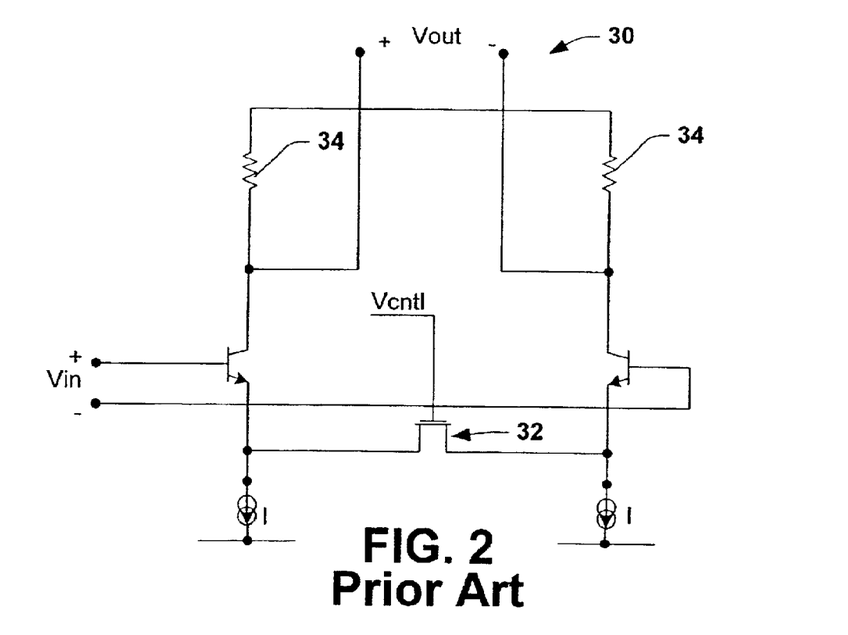
FIG. 2 is an example of another type of conventional variable gain amplifier.

A second type of traditional VGA circuit 30 is shown in FIG. 2. In this approach, the degeneration resistor 18 of FIG. 1 is replaced by a variable resistor, such as implemented using a MOSFET 32. The gain is varied in this circuit by varying the degeneration resistor. A larger resistance provides a smaller gain and vice versa. This circuit 30 has a constant output saturation level, which is set by the product of the current I and load resistors 34 for all values of the degeneration resistance. A problem with this circuit is that for the largest level of the input (and hence the lowest gain), the MOSFET 32 must be biased such that its drain-to-source impedance is high. This corresponds to a low Vgs-Vth (gate-to-source voltage minus the threshold voltage) of the MOSFET 32. Under this condition, the effective channel resistance is highly non-linear and depends strongly on the values of the drain and source voltages. Thus the amplifier is at its most non-linear behavior for the largest input, which is not a desirable property for a VGA.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the present invention provides a variable gain amplifier that includes an input stage that receives an input signal and converts the input signal into a corresponding intermediate signal. An output stage provides an output signal based on the intermediate signal and a gain control signal, with feedback signal being provided to the input stage as a function of the gain control signal, so that the intermediate signal varies as a function of the input signal and the feedback signal.

According to another aspect of the present invention, an internal gain control signal generator can be employed to convert an external gain control signal, such as from associated digital circuitry, to an appropriate gain control signal that is applied to the amplifier such that the gain of the amplifier varies in a linear-in-dB manner with respect to the external gain control signal.

Another aspect of the present invention provides a method for providing variable gain amplification in a variable gain amplifier. The method includes receiving an input signal at an input stage and converting the input signal into an intermediate signal. Different parts of the intermediate signal are provided to an output of the variable gain amplifier and to feedback circuitry based on a gain control signal. A feedback signal also is provided to the input stage based on the part of the intermediate signal directed to the feedback circuitry.

The following description and the annexed drawings set forth in certain illustrative aspects of the invention. These aspects are indicative, however, of a few ways in which the principles of the invention may be employed. Other advantages and novel features of the invention will become apparent from the following detailed description of the invention when considered in conjunction with the drawings.

DETAILED DESCRIPTION OF THE INVENTION

Figure 3:
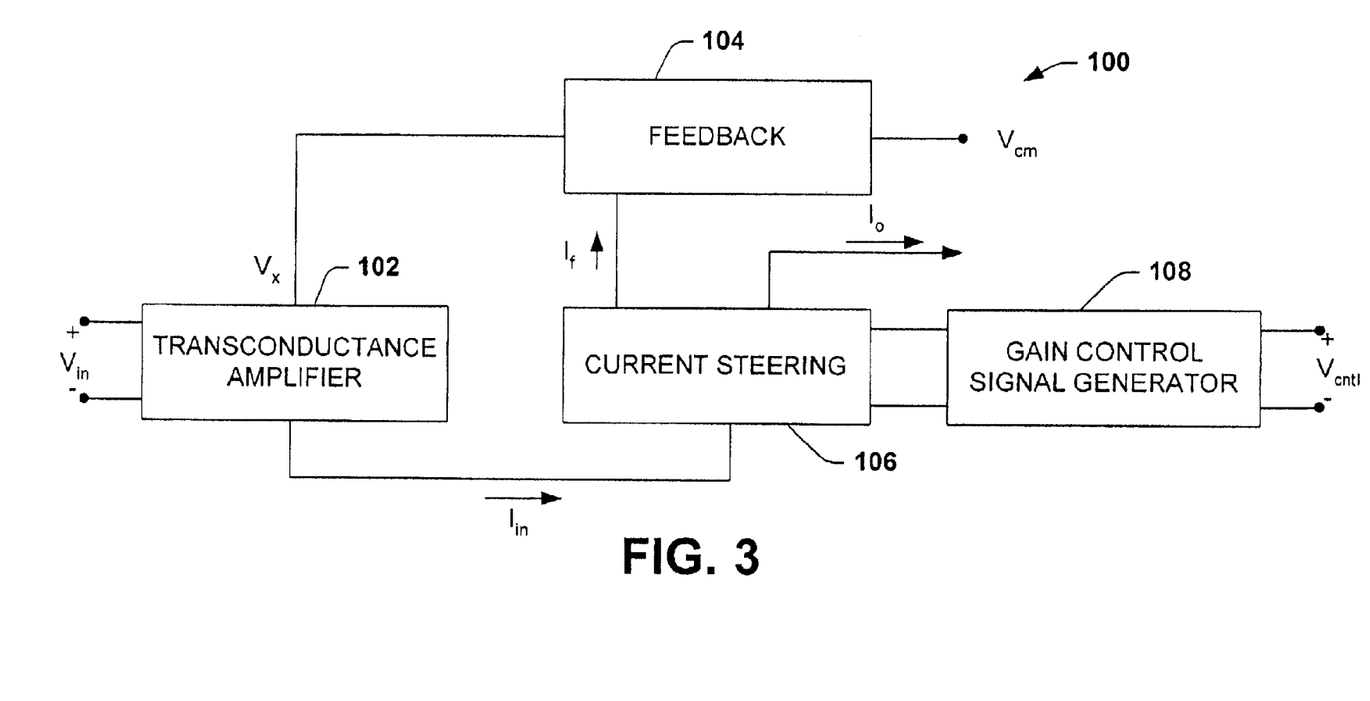
FIG. 3 is a block diagram illustrating an example of a variable gain amplifier in accordance with an aspect of the present invention.

FIG. 3 is a block diagram illustrating an example of a variable gain amplifier (VGA) 100 in accordance with an aspect of the present invention. The VGA 100 includes an input stage 102 having inputs operative to receive an input signal $V_{in}$, (e.g., a differential input voltage) for desired amplification. The input stage 102, for example, is a transconductance amplifier configured to convert the input voltage signal $V_{in}$ into a corresponding current signal, indicated at $I_{in}$. In accordance with an aspect of the present invention, the input stage 102 controls the input current $I_{in}$ as a function of the input voltage signal $V_{in}$, and a feedback voltage signal $V_x$ provided by an associated feedback circuit 104. The feedback circuit 104 is configured to control the feedback voltage signal so that the input stage 102 can provide a desired input current.

The input stage 102 provides the current $I_{in}$ to a current steering system 106. The current steering stage 106 is operative to provide an output signal $I_o$ according to a gain control signal. One or more current sources also can be employed to provide additional current at the output, such that the output signal $I_o$, is the sum of the current source signals and the current provided by the current steering stage 106. The current steering stage, for example, implements gain control by directing part of the input current $I_{in}$, to the output and the remaining part of the current, indicated as $I_f$, to the feedback circuit 104. The current steering stage 106 controls the proportions of current being directed to the output and to the feedback circuit 104 based on the gain control signal. The feedback circuit 104 generates the voltage $V_x$ as a function of the amount of the current $I_f$ that the current steering stage 106 passes to the feedback circuit. An accurate common mode voltage $V_{cm}$ is provided to the feedback circuit to facilitate its operation.

In accordance with an aspect of the present invention, the gain control signal can be generated in the analog domain by an analog gain control signal generator 108. The signal generator 108 is configured to preprocess an external gain control signal and convert the external signal to a desired form. For example, a differential external gain control signal $V_{cntl}$, such as provided by associated digital circuitry (e.g., a digital processor), may not allow for desired linear in dB gain control. Thus, in accordance with an aspect of the present invention, the signal generator 108 can process the external gain control signal in the analog domain and convert the external gain control signal to a desired internal gain control signal. The internal gain control signal is applied to the current steering system 106, such that the overall gain of the amplifier 100 varies linearly in dB with respect to the external control voltage signal. In this way, gain control implemented by the current steering stage 106 is facilitated.

Figure 4:
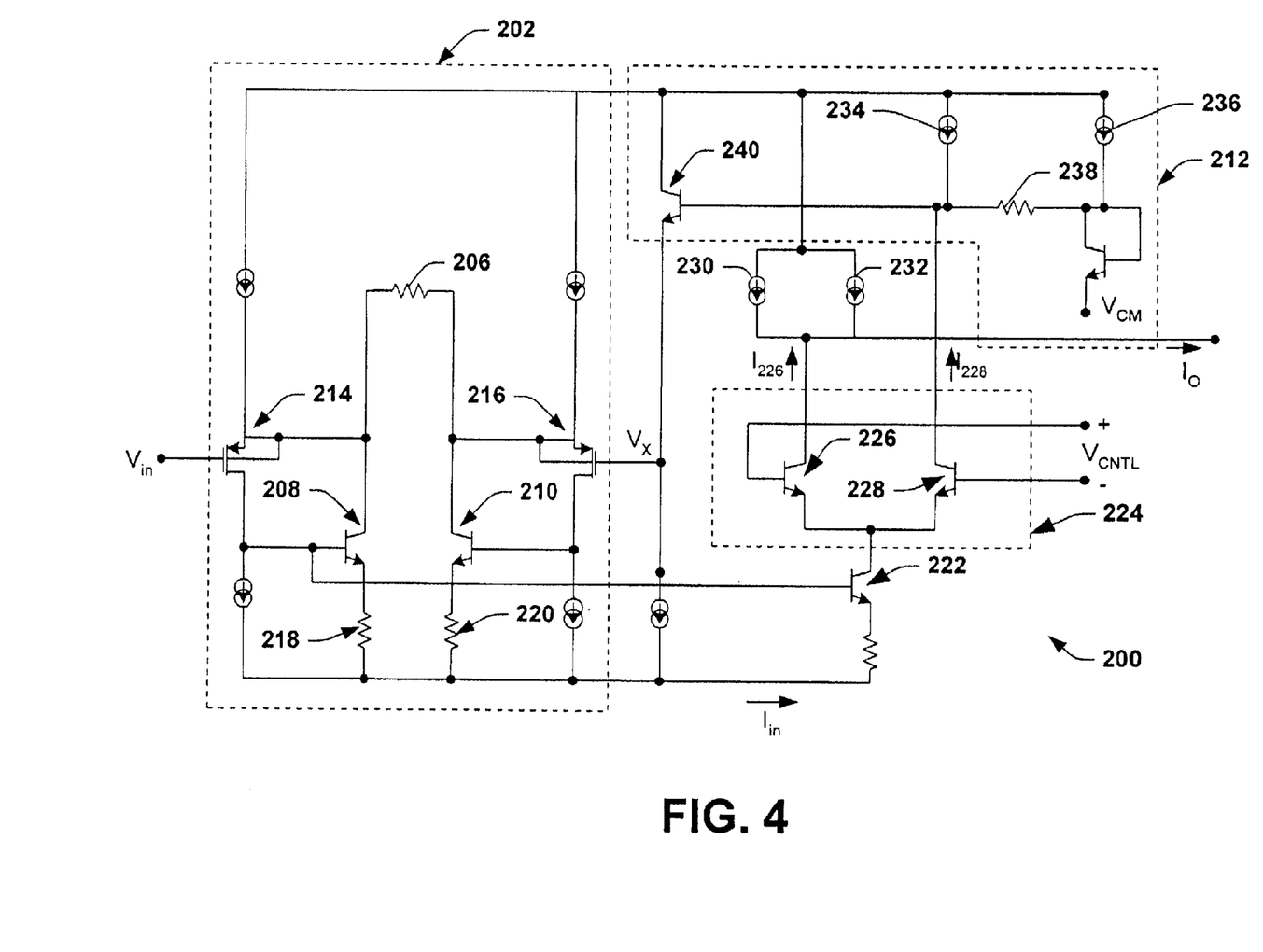
FIG. 4 is an example of part of a variable gain amplifier circuit in accordance with an aspect of the present invention.
Figure 5:
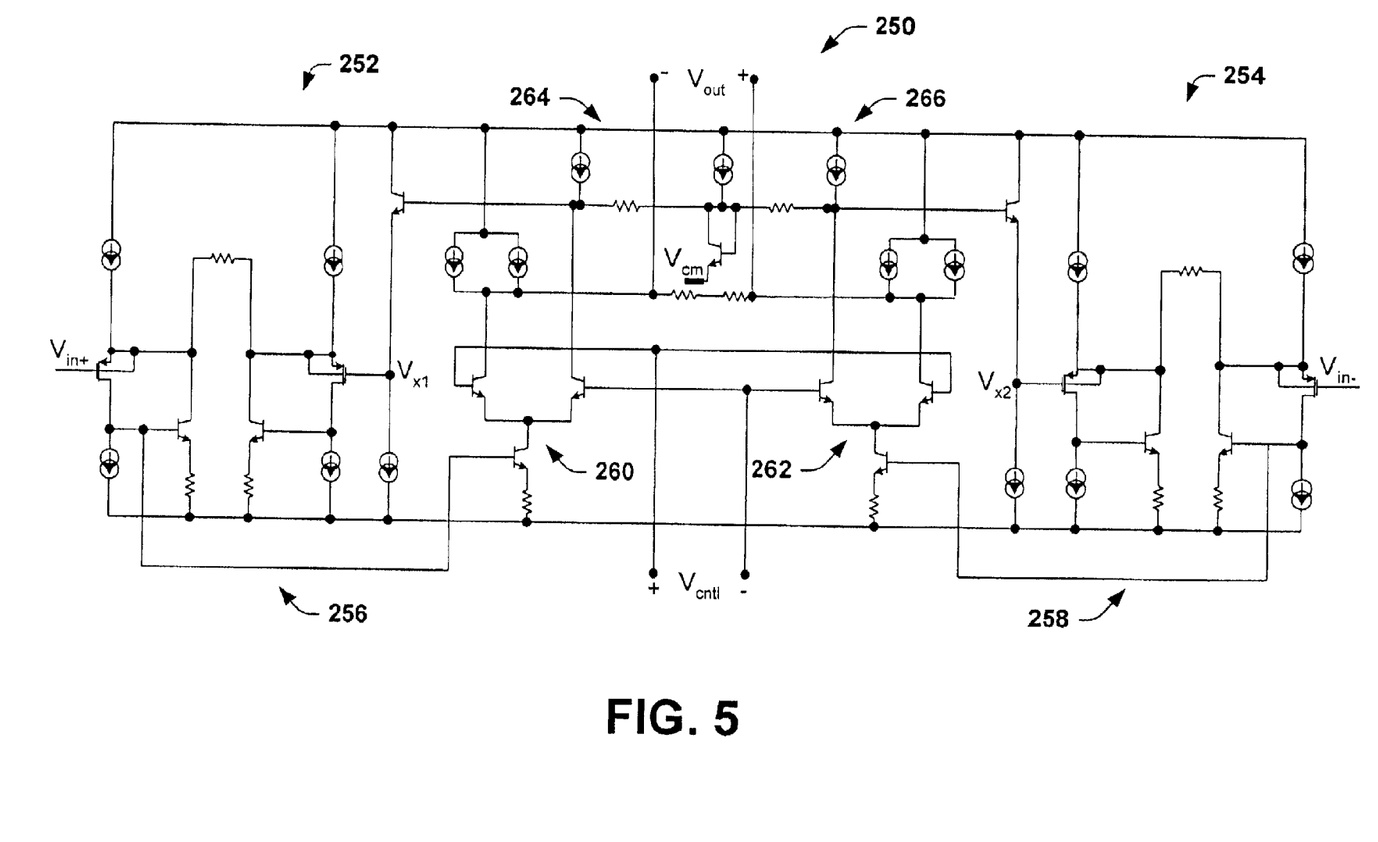
FIG. 5 is an example of a variable gain amplifier circuit in accordance with an aspect of the present invention.

FIG. 4 illustrates a half-circuit implementation for a VGA 200 in accordance with an aspect of the present invention. A corresponding full circuit implementation is illustrated in FIG. 5. The VGA 200 provides a low power variable gain amplifier topology employing feedback to effectively limit the maximum AC current that can flow through the devices in the amplifier. This affords the low-power dissipation in the circuit as well as desired linearity at the output for substantially all levels of the input signal.

The VGA 200 includes an input stage (e.g., including a linear transconductance amplifier) 202 operative to convert an input voltage $V_{in}$ into a corresponding current $I_{in}$. In the full circuit of FIG. 5 the input voltage $V_{in}$ is a differential input. The input stage 202 includes a resistor 206 coupled between collectors of a pair of bipolar transistors 208 and 210. The input voltage $V_{in}$ is provided to a gate of a transistor device (e.g., a PMOS FET) 214 and a feedback voltage $V_x$ is provided at a gate of a transistor device (e.g., a PMOS FET) 216.

The drain of the device 214 is coupled to a base of the device 208 and the drain of the device 216 is coupled to the base of the device 210. The source of device 214 is connected to one end of resistor 206 and the source of device 216 is connected to the other end of resistor 206. Thus, in operation, the source of the device 214 follows the input voltage $V_{in}$, while the source of 216 follows feedback voltage $V_x$. As a result, the voltage drop across the resistor 206 is equal to $V_R=V_{in}-V_x$. A current of value $I_{in}=(V_{in}-V_x)/R$ (where R is the resistance of the resistor 206) is thus induced in the resistor 206. Accordingly, the current $I_{in}$ flows through the collectors of the transistor devices 208 and 210. In particular, the device 208 is in a current mirror configuration with the device 222. Thus, the collector current of the device 222 equals that of device 208, which is $I_{in}$.

In accordance with an aspect of the present invention, the feedback voltage $V_x$ is varied as a function of the gain control signal to maintain a substantially constant maximum voltage amplitude across the resistor 206. This enables desired constant linearity performance of the amplifier output over the range of input amplitudes.

The transistor 222 supplies the input current $I_{in}$ to the current steering system 224, which includes two transistors 226 and 228 that receive a differential gain control signal $V_{cntl}$. The gain control signal $V_{cntl}$ determines how much of the input current $I_{in}$ will be directed through the respective transistors 226 and 228. The transistor 226 routes an amount of the input current $I_{in}$ to contribute to the output current $I_o$ and the other transistor 228 provides the remaining current to the feedback stage 212 according to the gain control signal $V_{cntl}$. The proportional amount of current routed through each of the transistors 226 and 228 can range from all the input current $I_{in}$ to no input current. In accordance with an aspect of the present invention, the gain control signal $V_{cntl}$ is generated in the analog domain based on a gain control signal from a digital section of associated circuitry so as to provide desired gain control that is linear in dB. The VGA 200 also can include one or more current sources 230 and 232 that are operative to provide current to the output, such that the output current $I_o$ is the sum of the currents from the current sources 230 and 232 and the current from the transistor 226 (e.g., $I_o=I_{230}+I_{232}+I_{226}$). The current sources 230 and 232 are provided to maintain accurate bias at the collector of the transistor 226.

The feedback stage 212 includes current sources 234 and 236 that supply current to end nodes of a feedback resistor 238. A common mode input voltage $V_{cm}$ also is provided to an input of the feedback stage 212. The current through the feedback resistor 238, in turn, controls the voltage at the base of a transistor 240 so as to provide the corresponding feedback voltage $V_x$ to the respective input of the transconductance amplifier 202.

A study of the half-circuit 200 reveals that the feedback voltage $V_X$ can be expressed as:

$$V_X = [\alpha(V_{in} - V_X)/R_e]R_f \qquad \text{Eq.1}$$

or $$V_X = \alpha^* R_f^* V_{in}/(R_e + \alpha R_f)$$

where:
- $R_e$ is the value of the resistor 206,
- $R_f$ is the value of a feedback resistor 238, and
- $\alpha$ is a ratio functionally related to the ratio of the current through transistor 228 and the total current $I_{in}$.

From Eq. 1, the term $\alpha$ corresponds to the gain control mechanism for the circuit. The output current $I_o$ of the half-circuit 200, thus, can be expressed as:

$$I_o = (1-\alpha)(V_{in} - V_X)/R_e \qquad \text{Eq.2}$$

The above expression for $V_X$ of Eq. 1 thus can be substituted into Eq. 2, so as to provide:

$$I_o = (1-\alpha)/(R_e + \alpha R_f) V_{in} \qquad \text{Eq.3}$$

In practice, it is to be appreciated that a typical usable range of the circuit is from $\alpha=0$ to about $\alpha=0.5$. Thus, the output current $I_o$ varies from $V_{in}/R_e$, which corresponds to a peak gain condition, to $V_{in}/R_f$ (for $R_f \gg R_e$), which corresponds to the minimum gain of the amplifier 200. It is to be understood and appreciated that the output current $I_o$ can be converted to a voltage by using an output resistor, such as shown in the full circuit implementation of FIG. 5.

As mentioned above, the term $\alpha$ is related to the ratio of currents in the transistor 228 and the total current $I_{in}$. Assuming that the transistors 226 and 228 are matched transistors, it can be shown that the term $\alpha$ can be expressed as:

$$\alpha = 1/(1 + n \exp(V_{cntl}/V_t)) \qquad \text{Eq.4}$$

where:
- n is a ratio of device areas of the transistors 226 and 228, respectively; and
- $V_t$ is the thermal voltage of the bipolar transistors 226 and 228

Further, by substituting Eq. 4 into Eq. 3, the output current $I_o$ of the half-circuit 200 can be expressed as:

$$I_o = \{(n^* \exp(V_{cntl}/V_t))/(1 + n^*(R_e/(R_e+R_f))^* \exp(V_{cntl}/V_t))\}^* V_{in} \qquad \text{Eq.5}$$

It many circumstances, it is desirable to have the gain be linear in dB, such as in response to an external control $V_{ex}$. If the gain is linear in dB, the output expression of Eq. 5 can reduce to:

$$I_o = K \exp(-V_{ex}/V_t)^* V_{in}. \qquad \text{Eq.6}$$

where K is a constant of proportionality.
Typically, the external gain control signal is generated by digital circuitry, such as by a digital processor programmed to implement desired gain control. However, if the external gain control signal $V_{ex}$ is applied directly to the current steering system 224, the gain of the VGA 200 varies with the control voltage $V_{ex}$ as given by Eq. 5 above, which is not a linear in dB characteristic. As a result, to generate a desired gain control signal that is linear in dB such that Eq. 5 can be reduced to the form of Eq. 6, the external control voltage is pre-processed in the analog domain in accordance with an aspect of the present invention.

As the input level increases, in order to achieve a constant output level, the gain must be decreased through $V_{ex}$. In the VGA 200, as the associated digital circuitry varies $V_{ex}$ to meet this objective, the ratio of current flowing through the resistor 238 is modified. In this way, the feedback voltage $V_x$ changes in response to changes in the external gain control signal $V_{ex}$, such that the voltage swing across the resistor 206 is held substantially fixed. Thus, the input stage in this design does not need to be "overdesigned" for the largest input signal. This functionally helps to keep the power dissipation low in the input stage. As a result, the linearity of the circuit 200 can be made substantially constant at the output, regardless of the level of the input signal, provided the transistors 226 and 228 are biased correctly.

By way of illustration, the bias set up for devices 226 and 228, which form the current steering system 224, become an important consideration when implementing the VGA 200 in practice. For example, in the absence of any time varying input, a static DC current tends to flow through the transistor 228. The current provided by current source 234 is a replica bias current, which can be generated by an associated differential pair that has $V_{cntl}$ applied at its inputs. That is, the current from source 234 is set to be equal to the static current in the transistor 228. This helps to ensure that the collector of the transistor 228 is correctly biased, and draws no static DC through the feedback resistor 238. The collector of the transistor 226 is driven by current sources 230 and 232. For example, the current source 230 is a replica bias current similar to the current source 234. The current source 232 is derived from a common mode feedback. By using the current source 232 as a correction current, the common-mode voltage at the collector of the transistor 226 and its counterparts in the full-circuit implementation example of FIG. 5 can be set to a desired fixed value.

In view of the half-circuit 200 implementation described above, those skilled the art will understand and appreciate operation of the full circuit implementation 250 shown in FIG. 5. The VGA includes two half circuits 252 and 254, which are substantially similar to that shown and described in FIG. 4. Each of the half circuits 252 and 254 include input stages 256 and 258 that receive respective input signals $V_{in+}$ and $V_{in-}$. The input stages 256 and 258 provide respective input currents $I_{in1}$ and $I_{in2}$, which are derived based on the respective input signals $V_{in+}$ and $V_{in-}$ and feedback signals $V_{x1}$ and $V_{x2}$. The input currents $I_{in1}$ and $I_{in2}$ are provided to associated current steering pairs 260 and 262, which route current according to a gain control signal $V_{cntl}$, which according to an aspect of the present invention is linear in dB. As mentioned above, each of the current steering pairs 260 and 262 is operative to direct current to an output node of each half-circuit 252 and 254 and to associated feedback circuitry 264 and 266. The amount of current the current steering pairs 260 and 262 route to their outputs defines the output voltage $V_{out}$ of the VGA 250. The current provided to the respective feedback circuitry 264 and 266 is employed to derive the feedback voltages $V_{x1}$ and $V_{x2}$. Thus, the feedback circuitry implements desired current mode feedback as a function of gain control.

Figure 6:
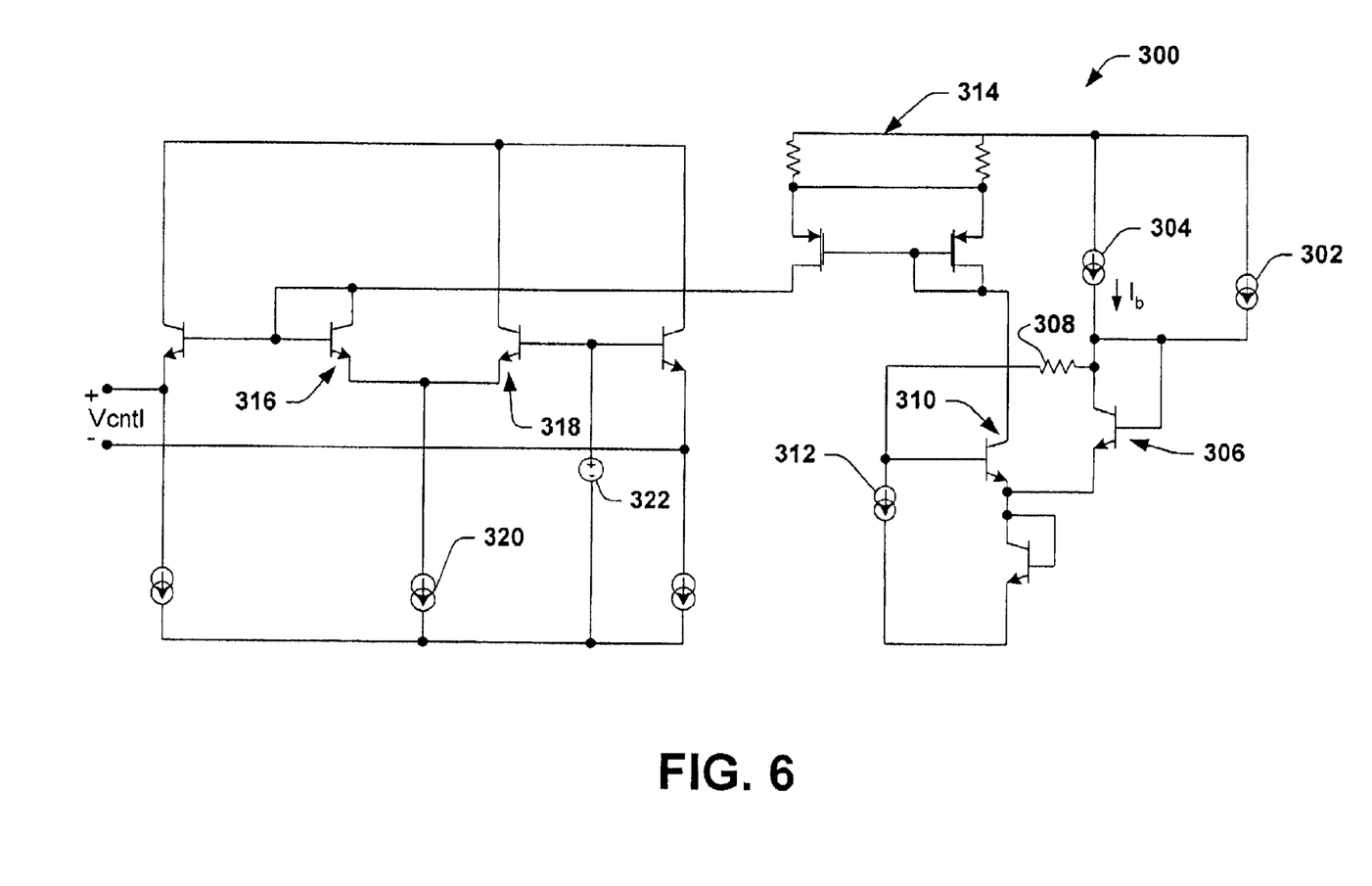
FIG. 6 is an example of an analog gain control signal generator in accordance with an aspect of the present invention.

FIG. 6 illustrates an example of a circuit 300 operative to convert an external gain control signal into a corresponding internal gain control signal such that the overall gain control is linear in dB in accordance with an aspect of the present invention. The circuit 300 includes a voltage controlled current source (e.g., a linear transconductance converter)

302 that converts an external control voltage signal $V_{ex}$, such as provided by associated digital circuitry (not shown), to a corresponding current (e.g., $I=V_{ex}/R_1$, where $R_1$ is a resistance of the transconductance converter).

By way of example, the current source 302 is connected in parallel with another current source 304, with both sourcing current to a node coupled to a collector of a diode-connected transistor 306. A resistor 308 having a resistance equal to R1 is coupled between the collector of the transistor 306 and the base of another transistor 310. A current source 312, which provides a current equal to that of current source 302, also is connected to the base of the transistor 310.

The base-emitter voltage of the transistor 310 is decreased by $V_{ex}$ as shown in FIG. 6, compared to that of the transistor 306. Because the transistor 310 is connected as a current mirror relative to the transistor 306, the current in the transistor 310 can be expressed as:

$$I_{310}=I_b*\exp(-V_{ex}/V_t) \qquad \text{Eq.7}$$

where:

$I_b$ is the current from current source 304.

An associated current mirror 314 routes current equal to the current through the transistor 310 through a diode-connected transistor 316. The transistor 316 is connected with a transistor 318, such that the emitters are connected together and feeding an associated current source 320. In this example, the current source 320 is set to provide current equal to that of the current source 304 (e.g., $I_{320}=I_b$). Due to this arrangement, the current through the transistor 318 can be expressed as:

$$I_{318}=I_b(1-\exp(-V_{ex}/V_t)). \qquad \text{Eq.8}$$

The current through the transistors 316 and 318 maintain a constant tail current of $I_b$ via the current source 320, which is coupled to the respective emitters of the transistors. The base of the transistor 318 is held at a fixed bias voltage, such as by voltage source 322. The output of the circuit 300 provides a control voltage $V_{cntl}$, which is applied to the VGA. By deriving $V_{cntl}$ from an external gain control signal $V_{ex}$, the overall gain control of a VGA 200 (FIG. 4) can be linear in dB as a function of $V_{ex}$ in accordance with an aspect of the present invention. The control voltage $V_{cntl}$ thus can be expressed as:

$$V_{cntl}=V_t*\ln\{m \exp(-V_{ex}/V_t)/(1-\exp(-V_{ex}/V_t))\} \qquad \text{Eq.9}$$

where:

m is a ratio of the device areas of transistors 318 and 316, respectively.

When the control voltage $V_{cntl}$ is substituted back into Eq. 5, the output current $I_o$ of the half circuit 300 (FIG. 3) becomes:

$$I_o=n*m*\exp(-V_{ex}/V_t)/(1-\exp(-V_{ex}/V_t)+m*n(R_e/(R_e+R_f))*\exp(-V_{ex}/V_t))*V_{in} \qquad \text{Eq.9}$$

where:

n is ratio of device areas of the transistors 226 and 228, respectively, $R_e$ is the resistance of the resistor 206, and $R_f$ is the resistance of the resistor 238.

Accordingly, if the product m*n=(Rf+Re)/Re, the expression of Eq. 9 further reduces to:

$$I_o=(Rf+Re)/Re*\exp(-V_{ex}/V_t)V_{in}. \qquad \text{Eq.10}$$

Advantageously, the expression of Eq. 10 provides a particular form that enables linear-in-dB gain control, as desired, in accordance with an aspect of the present invention. The gain of the amplifier is proportional to $\exp(-V_{ex}/V_t)$, which implies that the gain varies in a linear-in-dB manner with respect to $V_{ex}$.

In view of the description of the half-circuit of FIG. 4 and internal control voltage generator of FIG. 6, it is to be appreciated that a full VGA, such as shown in FIG. 5, in accordance with an aspect of the present invention, is operative to maintain desired linearity performance at the output. The VGA architecture further helps to keep the power dissipation low in the input stages and enables desired constant linearity at the output.

Figure 7:
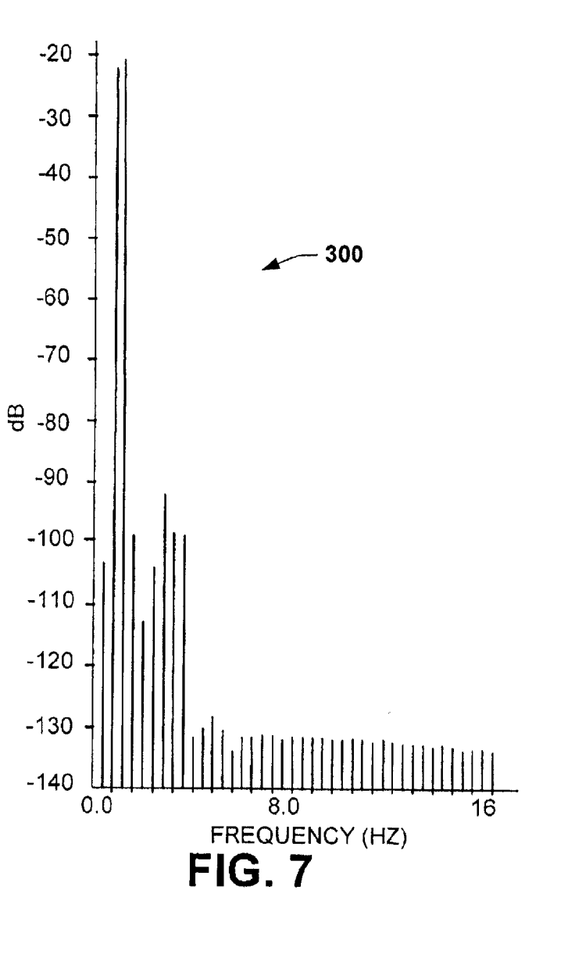
FIG. 7 is an example of a graph of illustrating performance of a VGA operating with a low gain setting in accordance with an aspect of the present invention.
Figure 8:
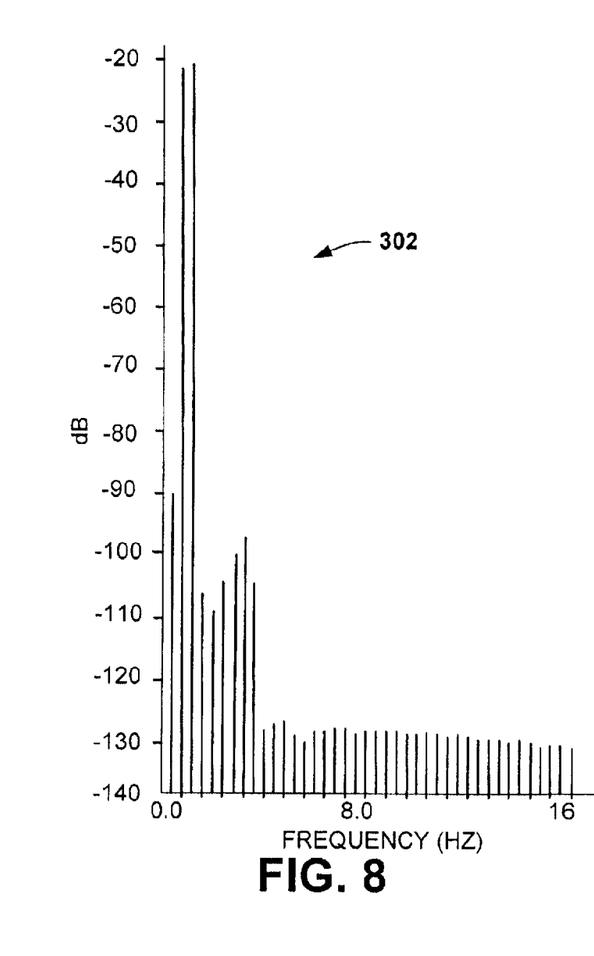
FIG. 8 is an example of a graph of illustrating performance of a VGA operating with an intermediate gain setting in accordance with an aspect of the present invention.
Figure 9:
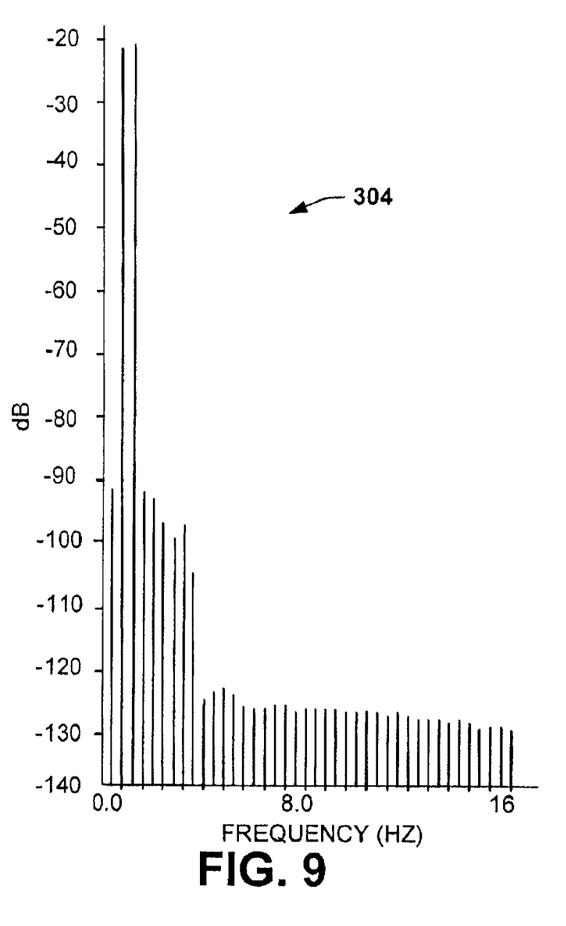
FIG. 9 is an example of a graph of illustrating performance of a VGA operating with a high gain setting in accordance with an aspect of the present invention.

FIGS. 7, 8 and 9 illustrate plots demonstrating desired linearity performance of a VGA implemented for three different gain settings in accordance with an aspect of the present invention. In particular, the graphs illustrate the output (in dB) versus frequency (in Megahertz) for various gain settings. For example, FIG. 7 illustrates VGA performance for a low gain setting (indicated at 300), FIG. 8 for an intermediate gain setting (indicated at 302) and FIG. 9 for a high gain setting (indicated at 304). Each of the graphs 300, 302, 304, for purpose of illustration, corresponds to results of two-tone tests, in which two tones of substantially equal amplitude are applied at the input (e.g., $V_{in}$) to a VGA configured in accordance with an aspect of the present invention. For small tones, the gain is the largest while for the largest tones the gain is the smallest. This is done to ensure a constant desired output signal, which is a desired characteristic for an automatic gain control loop. The linearity performance for the examples of FIGS. 7, 8 and 9 is measured by a ratio of the desired signal to the (undesired) third-order intermodulation products. As can be seen from the plots 300, 302 and 304, the amplitude ratios of the third order products to the desired signal is substantially similar for three gain settings, which is a desirable property of the VGA.

Figure 10:
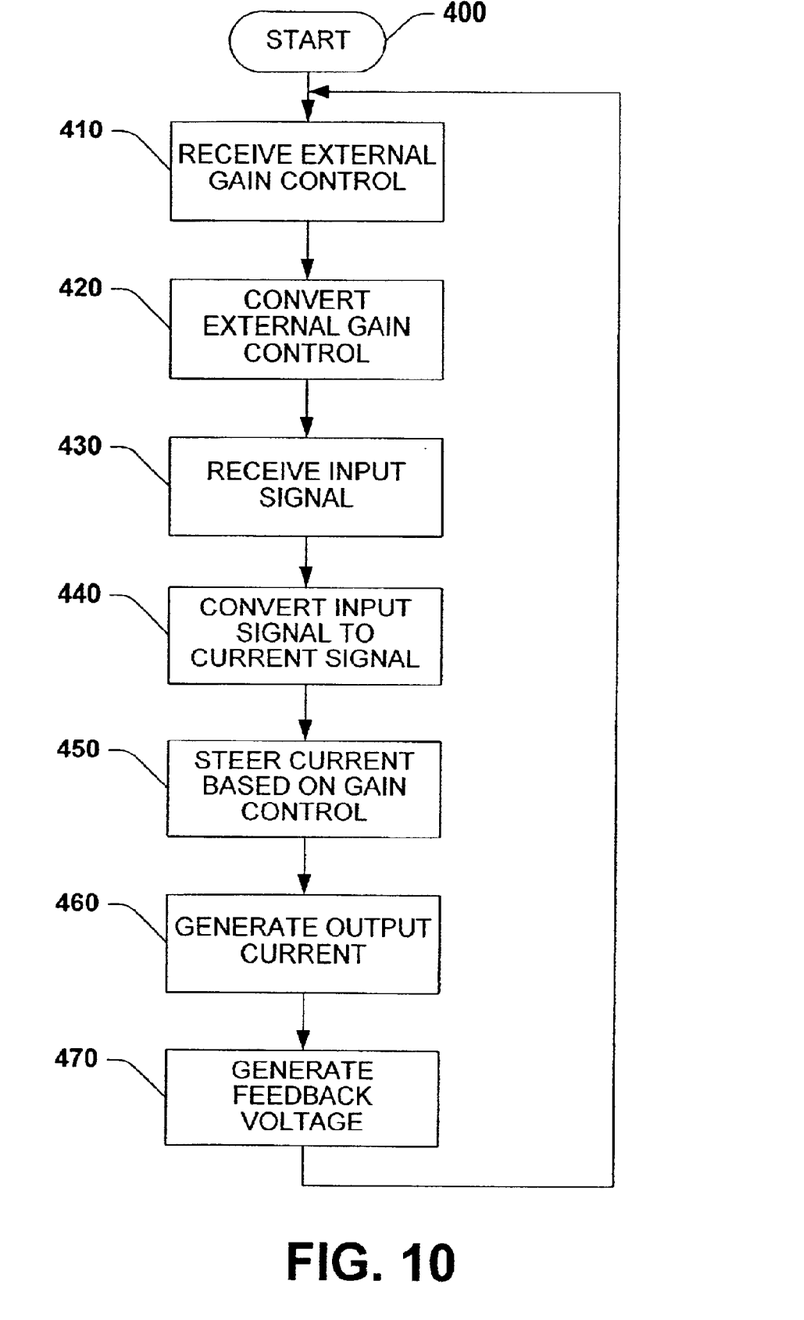
FIG. 10 is a flow diagram illustrating a methodology for implementing a variable gain amplifier in accordance with an aspect of the present invention.

In view of the foregoing structural and functional features described above, a methodology in accordance with various aspects of the present invention will be better appreciated with reference to FIG. 10. FIG. 10 illustrates a methodology for implementing a variable gain amplifier in accordance with an aspect of the present invention. While, for purposes of simplicity of explanation, the methodology is shown and described as executing serially, it is to be understood and appreciated that the present invention is not limited by the illustrated order, as some aspects could and often do, in accordance with the present invention, occur in different orders and/or concurrently with other aspects from that shown and described herein. Moreover, not all illustrated features may be required to implement a methodology in accordance with an aspect the present invention.

The methodology begins at 400, such as in conjunction with activation of a VGA implemented in accordance with the present invention. The activation further can include operation of associated digital circuitry programmed and/or configured to provide an external gain control signal to the VGA based on the output of the VGA. At 410, an external gain control signal also is received. The gain control signal can be provided by the associated digital circuitry as a function of an output of the VGA. The gain control signal, for example, controls the VGA to provide a substantially constant output, with desired linearity, regardless of the level of the input signal.

At 420 the external gain control signal is converted to a desired gain control signal, namely, one that allows for gain control that is substantially linear in dB. The conversion, for example, occurs in the analog domain by an analog system.

This gain control signal generated from the external gain control signal is applied to the amplifier. The VGA and associated analog gain control signal generator can be implemented in a single integrated circuit. Next at 430, an input signal is received. For example, the input signal is a differential voltage potential applied at respective inputs of the VGA.

At 440, the input signal (410) is converted to a corresponding current signal, such as by a transconductance linear amplifier. In particular, each of the differential inputs is appropriately converted to a respective current signal. Because the VGA employs current signals, desired current mode feedback is facilitated. Next, at 450, current steering is implemented based on the gain control signal generated at 430. For example, current steering occurs by directing a portion of the input current (440) to an output of the VGA so as to generate the output current at 460. The current steering (450) also directs another portion of the input current to an associated feedback circuit. The output current can be converted into a corresponding voltage, such as via a suitable resistor.

At 470, feedback is generated for adjusting the functionality associated with converting the input signal into current (440), such as being implemented in a linear transconductance amplifier. For example, the feedback is generated as a feedback voltage as a function of the portion input current directed to the feedback in conjunction with the current steering (450). The feedback voltage is supplied to an input stage of the VGA so as to help maintain a voltage swing within the amplifier at a substantially fixed level as the input voltage changes, which helps keep power dissipation low. As a result, an appropriate amount of the current generated at 440 can be steered in order to maintain desired linearity at the output (460).

What has been described above includes illustrative implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A variable gain amplifier, comprising:
   an input stage that receives an input signal and converts the input signal into a corresponding intermediate signal;
   an output stage that provides an output signal based on the intermediate signal and a gain control signal; and
   a feedback stage that provides a feedback signal to the input stage as a function of the gain control signal, the intermediate signal varying as a function of the input signal and the feedback signal.

2. The amplifier of claim 1, the input stage further comprising a transconductance amplifier that converts the input signal into a corresponding current signal based on the feedback signal and the input signal, the corresponding current signal defining the intermediate signal.

3. The amplifier of claim 2, the feedback stage comprising circuitry to implement current mode feedback for the input stage according to the gain control signal.

4. The amplifier of claim 1, the output stage further comprising a current steering system operative operative to direct a first part of the intermediate signal to the output signal and a second part of the intermediate signal to the feedback stage, which provides the feedback signal based on the second part of the intermediate signal.

5. The amplifier of claim 4, the current steering system providing the first and second parts of the intermediate signal to each of the output signal and the fzedhack stage in proportions functionally related to the gain control signal.

6. A variable gain amplifier, comprising:
   an input stage that receives an input signal and converts the input signal into a corresponding intermediate signal;
   an output stage that provides an output signal based on the intermediate signal and a gain control signal;
   a feedback stage that provides a feedback signal to the input stage as a function of the gain control signal, the intermediate signal varying as a function of the input signal and the feedback signal; and
   an analog gain control system coupled to the output stage, the gain control system being operative to receive an external gain control signal and to convert the external gain control signal to the gain control signal in an analog domain.

7. The amplifier of claim 6, the analog gain control system providing the gain control signal to allow for gain control of the amplifier that is substantially linear in dB with respect to the external gain control signal.

8. The amplifier of claim 7, the analog gain control system further comprising bipolar transistors arranged to generate the gain control signal in the analog domain so as to enable gain control of the amplifier that is linear in dB with respect to the external gain control signal.

9. The amplifier of claim 7, the analog gain control system being configured to generate the gain control signal so that gain control of the amplifier is proportional in $\exp(-V_{ex}/V_t)$, where $V_{ex}$ is the external gain control signal and $V_t$ is a constant thermal voltage of bipolar transistors that form part of the analog gain control system.

10. A variable gain amplifier, comprising:
    an input stage that receives an input signal and provides a corresponding intermediate signal;
    an output stage that provides an output signal based on the intermediate signal and an internal gain control signal;
    gain control stage operative to receive an external gain control signal and to convert the external gain control signal to the internal gain control signal; and
    a feedback stage that provides a feedback signal to the first amplifier stage as a function of the internal gain control signal.

11. The amplifier of claim 10, the gain control stage providing the internal gain control signal so as to enable gain control of the amplifier that is substantially linear in dB with respect to the external gain control signal.

12. The amplifier of claim 11, the gain control stage further comprising transistors arranged to generate the internal gain control signal functionally related to the external gain control signal, such that the internal gain control signal allows for gain control of the amplifier that is substantially linear in dB with respectto the external gain control signal.

13. The amplifier of claim 11, the gain control stage further comprising at least one bipolar transistor that enables the gain control stage to generate the internal gain control signal so that the gain control of the amplifier is proportional to $\exp(-V_{ex}/V_t)$, where $V_{ex}$ is the external gain control signal and $V_t$ is a constant thermal voltage of the at least one bipolar transistor.

14. The amplifier of claim 10, the input stage further comprising a transconductance amplifier operative to convert the input signal into a corresponding current signal based on the feedback signal and the input signal.

15. The amplifier of claim 14, the feedback stage providing current mode feedback to the transconductance amplifier according to the internal gain control signal.

16. The amplifier of claim 14, the output stage further comprising a current steering system operative to direct a first part of the corresponding current signal to the output signal and a second part of the intermediate signal to the feedback stage based on the internal gain control signal, the feedback stage providing the feedback signal based on the second part of the intermediate signal.

17. The amplifier of claim 16, the current steering system providing the intermediate signal to each of the output signal and the feedback stage in proportions functionally related to the gain control signal.

18. A variable gain amplifier, comprising:
means for converting a received input signal into an intermediate signal;
means for steering one part of the input signal to an output and another part of the input signal to means for generating a feedback signal based on a gain control signal; and
the means for generating a feedback signal providing the feedback signal to the means for converting based on the another part of the input signal and the gain control signal.

19. A variable gain amplifier, comprising:
means for converting a received input signal into an intermediate signal;
means for steering one part of the input signal to an output and another part of the input signal to means for generating a feedback signal based on a gain control signal; and
the means for generating a feedback signal providing the feedback signal to the means for converting based on the another part of the input signal; and
means for converting an external gain control signal to the gain control signal that is provided to the means for steering so as to implement a gain control of the amplifier that is substantially linear in dB.

20. A variable gain amplifier, comprising:
an input stage that receives an input signal and a feedback signal and provides an intermediate signal as a function of the input signal and the feedback signal;
an output stage that provides an output signal based on the intermediate signal and a gain control signal; and
a feedback stage that provides the feedback signal to the input stage as a function of the gain control signal so as to maintain a substantially constant maximum amplitude for a difference between the input signal and the feedback signal in the input stage, thereby providing substantially constant output linearity over a range of amplitudes for the input signal.

21. The amplifier of claim 20, the output stage further comprising a current steering system operative to direct a first part of the intermediate signal to the output signal and a second part of the intermediate signal to the feedback stage, which provides the feedback signal based on the second part of the intermediate signal.

22. A variable gain amplifier, comprising:
an input stage that receives an input signal and a feedback signal and provides an intermediate signal as a function of the input signal and the feedback signal;
an output stage that provides an output signal based on the intermediate signal and a gain control signal;
a feedback stage that provides the feedback signal to the input stage as a function of the gain control signal so as to maintain a substantially constant maximum amplitude for a difference between the input signal and the feedback signal in the input stage, thereby providing substantially constant output linearity over a range of amplitudes for the input signal; and
an analog gain control system coupled to the output stage, the gain control system being operative to receive an external gain control signal and to convert the external gain control signal to the gain control signal in an analog domain.

23. The amplifier of claim 22, the analog gain control system providing the gain control signal to allow for gain control of the amplifier that is substantially linear in dB with respect to the external gain control signal.

24. A method for providing variable gain amplification in a variable gain amplifier, comprising:
receiving an input signal at an input stage;
converting the input signal into an intermediate signal;
directing part of the intermediate signal to an output of the variable gain amplifier based on a gain control signal;
directing another part of the intermediate signal to feedback circuitry based on the gain control signal; and
providing a feedback signal to the input stage based on the another part of the signal directed to the feedback circuitry.

25. A method for providing variable gain amplification in a variable gain amplifier, comprising:
receiving an input signal at an input stage;
converting the input signal into an intermediate signal;
directing part of the intermediate signal to an output of the variable gain amplifier based on a gain control signal;
directing another part of the intermediate signal to feedback circuitry based on the gain control signal;
providing a feedback signal to the input stage based on the another part of the signal directed to the feedback circuitry; and
an external gain control signal to the gain control signal in an analog domain so that gain control provided by the variable gain amplifier is substantially linear in dB.

26. The method of claim 25, the conversion of the external gain control signal further comprising, in the analog domain, converting the external gain control signal into an internal gain control signal so that the gain control of the amplifier is proportional to an exponential of the external gain control signal.

* * * * *